(12) United States Patent
Shutt et al.

(10) Patent No.: US 7,180,342 B1
(45) Date of Patent: Feb. 20, 2007

(54) FREQUENCY DOUBLER CIRCUIT WITH TRIMMABLE CURRENT CONTROL

(75) Inventors: James Shutt, Kent, WA (US); Harold Kutz, Snoquolmie, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 1332 days.

(21) Appl. No.: 09/977,111

(22) Filed: Oct. 11, 2001

Related U.S. Application Data

(60) Provisional application No. 60/243,708, filed on Oct. 26, 2000.

(51) Int. Cl.
*H03B 19/14* (2006.01)
(52) U.S. Cl. .................................................. 327/122
(58) Field of Classification Search ........ 327/113–114, 327/116, 119, 122, 123
See application file for complete search history.

(56) References Cited

U.S. PATENT DOCUMENTS

| | | | |
|---|---|---|---|
| 5,202,687 A | | 4/1993 | Distinti .................... 341/158 |
| 5,317,202 A | * | 5/1994 | Waizman .................. 327/156 |
| 6,121,805 A | * | 9/2000 | Thamsirianunt et al. .... 327/175 |
| 6,144,327 A | | 11/2000 | Distinti et al. ............. 341/126 |
| 6,211,708 B1 | * | 4/2001 | Klemmer ................... 327/122 |

OTHER PUBLICATIONS

CYPR-CD00196; "A Novel Band-Gap Circuit for Providing an Accurate Reference Voltage Compensated for Process State, Process Variations and Temperature"; U.S. Appl. No. 09/964,991; filed Sep. 26, 2001; Kutz et al.
CYPR-CD00201; "A Crytal-Less Oscillator Circuit With Trimmable Analog Current Control for Increased Stability"; U.S. Appl. No. 09/957,084; filed Sep. 19, 2001; Mar et al.

* cited by examiner

Primary Examiner—David Mis

(57) ABSTRACT

A frequency doubler circuit with trimmable current control. In one embodiment, the present invention provides a circuit comprising an oscillator with a current source and a frequency doubler circuit coupled to the current source. In one embodiment, the current source is for generating a reference current. In one embodiment, the frequency doubler circuit is operable to receive a first frequency signal for generating a second frequency signal and also receiving the reference current. The frequency doubler circuit, using the reference current, operates to compensate for process variation of capacitance of the frequency doubler circuit and uses the reference current to maintain a known duty cycle. In one embodiment, the circuit further comprises a control loop for generating an output current, wherein the output current, operating in conjunction with the reference current, operates to compensate for process variation of capacitance of the frequency doubler circuit and uses the reference current to maintain a known duty cycle. In one embodiment, the current source comprises a trimmable current control.

36 Claims, 7 Drawing Sheets

FREQUENCY DOUBLER CIRCUIT WITH TRIMMABLE CURRENT CONTROL

RELATED U.S. APPLICATION

This application claims priority to the copending provisional patent application Ser. No. 60/243,708, entitled "Advanced Programmable Microcontroller Device," with filing date Oct. 26, 2000, and assigned to the assignee of the present application.

FIELD OF INVENTION

The present invention relates to the field of semiconductor devices. More particularly, the present invention relates a frequency doubler circuit with trimmable current control.

BACKGROUND OF THE INVENTION

Oscillator circuits are used with digital electronic circuits (e.g., microcontrollers and microprocessors) for a variety of uses including to generate a clock signal (e.g., a frequency signal) for synchronizing, pacing and coordinating the operations of the digital electronic circuit. Some common forms of oscillator circuits are crystal oscillator circuits and voltage controlled oscillators (VCO) circuits.

Often, it is desirable to generate a frequency signal that is double the frequency of the signal generated by the oscillator circuit. Frequency doubler circuits are used to double the frequency signal generated by an oscillator circuit. A frequency doubler circuit is a low cost alternative to manufacturing a larger circuit to generate a larger frequency signal. Rather, a smaller, less expensive circuit is manufactured, and the frequency signal it generates is doubled.

FIG. 1 is a block diagram 100 of a frequency doubler circuit 100 in accordance with the conventional art. Oscillator circuit 105 generates a first frequency signal 110. Delay locked loop circuit 115 receives first frequency signal 110 and generates a second frequency signal 120 that is double the value of first frequency signal 110. For example, if the value of first frequency signal 110 is substantially 24 MHz, the value of second frequency signal 120 will be substantially 48 MHz.

Often, frequency doubler circuit 100 comprises control loop circuit 135 for controlling the duty cycle of frequency doubler circuit 100. Filter circuit 125 converts second frequency signal 120 into DC voltage 130. Control loop circuit 135 receives DC voltage 130 and generates output current 140 for controlling the biasing of internal components of frequency doubler circuit 100 (e.g., inverters and transistors).

Some frequency doubler circuits comprise a plurality of capacitors. A disadvantage to the use of capacitors is that capacitors often vary due to the fabrication process or to temperature. In current frequency doubler circuits, it is not always of generally possible to adjust the current charging the capacitors to account for process variation. In order to ensure that capacitors are to the proper specifications, all capacitors should be tested and those that are not to specification are discarded, resulting in wasted parts.

Furthermore, devices comprising a frequency doubler circuit often require a highly controlled duty cycle to perform certain applications. Conventional frequency doubler circuits do not provide a highly controlled duty cycle as they do not compensate for capacitor process variation.

SUMMARY OF THE INVENTION

Accordingly, a need exists for a frequency doubler circuit that accounts for capacitance process variation without requiring external capacitors. A need also exists for a frequency doubler circuit that allows for a more accurate duty cycle. A need also exists for a frequency doubler circuit that requires fewer parts, and is thus less expensive.

A frequency doubler circuit with trimmable current control is presented. In one embodiment, the present invention is drawn to a circuit comprising an oscillator with a current source and a frequency doubler circuit coupled to the current source. In one embodiment, the current source is for generating a reference current. In one embodiment, the frequency doubler circuit is operable to receive a first frequency signal for generating a second frequency signal and also receiving the reference current. The frequency doubler circuit, using the reference current, operates to compensate for process variation of capacitance of the frequency doubler circuit and uses the reference current to maintain a known duty cycle.

In one embodiment, the circuit further comprises a control loop for generating an output current, wherein the output current, operating in conjunction with the reference current, compensates for process variation of capacitance of the frequency doubler circuit and uses the reference current to maintain a known duty cycle.

In one embodiment, the current source comprises a trimmable current control. In another embodiment, the current source is a digital to analog converter circuit comprising a trimmable current control. In one embodiment, the trimmable current control comprises a plurality of trimmable components.

In one embodiment, the present invention provides a circuit comprising a frequency doubler circuit and an oscillator circuit with trimmable current control for generating a first frequency signal. In another embodiment, the present invention provides a microcontroller comprising a frequency doubler circuit and an oscillator circuit with trimmable current control for generating a first frequency signal.

In one embodiment, the present invention provides a frequency doubler circuit that receives a reference current from a digital to analog converter circuit of an oscillator circuit. The reference current is determined by the trimmable current of the digital to analog converter circuit. The reference current acts to compensate for variations in capacitor elements of the frequency doubler circuit. Process variations and/or temperature variations can cause these variations. The reference current compensates for these variations making the duty cycle or time delay generated by the frequency doubler circuit match the duty cycle of the oscillator circuit, thereby providing higher frequency signal precision in the overall system. Therefore, the reference current acts to trim out variations in the capacitors of the frequency doubler circuit leading to matched delay between the two circuits.

The present invention provides a frequency doubler circuit that accounts for capacitance process variation without requiring external capacitors. The present invention also provides a frequency doubler circuit that allows for a more accurate duty cycle. The present invention provides a frequency doubler circuit that requires fewer parts, and is thus less expensive.

These and other objects and advantages of the present invention will become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
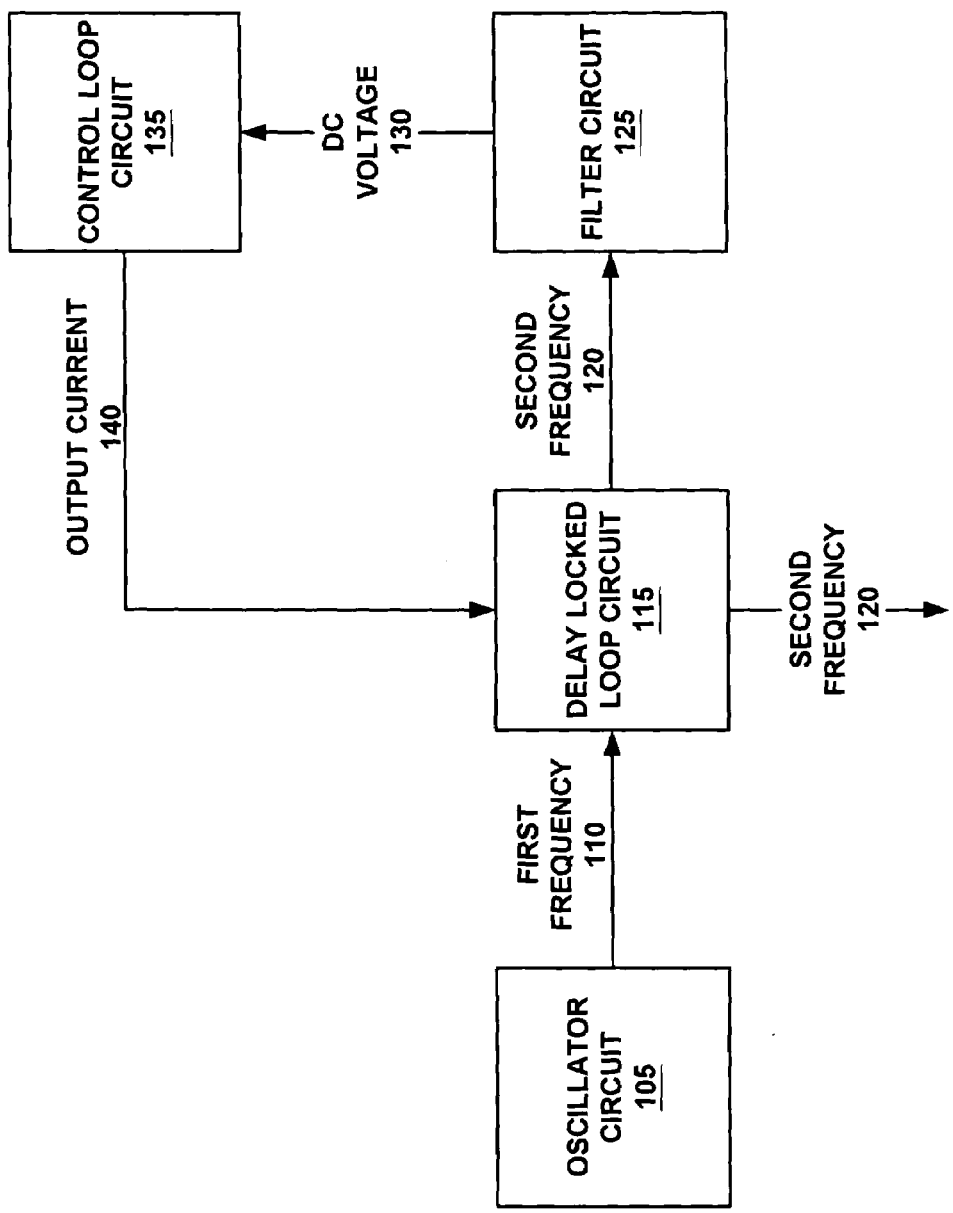
FIG. 1 is a block diagram of a frequency doubler circuit in accordance with the conventional art.
Figure 2:
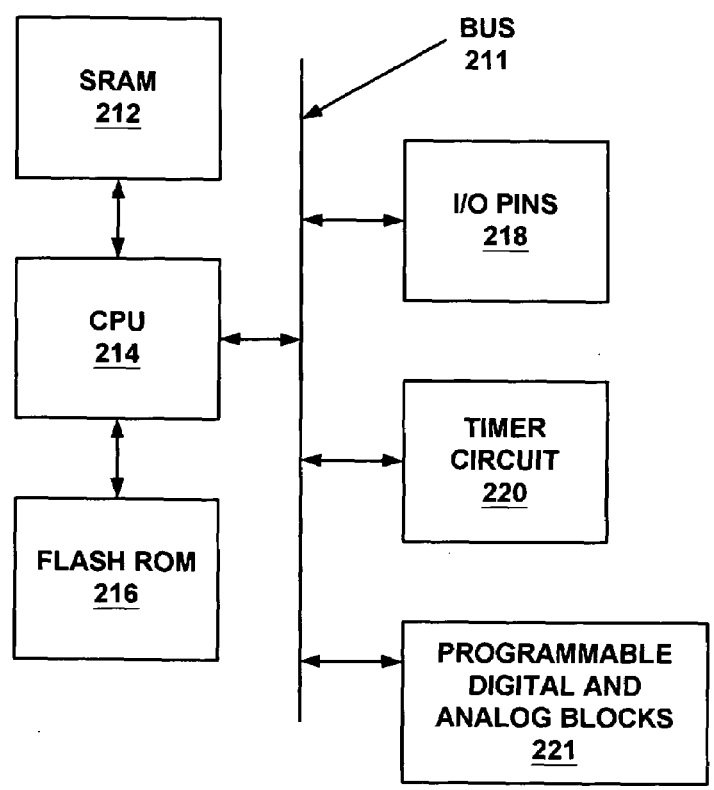
FIG. 2 is a block diagram showing an exemplary digital electronic circuit (or microcontroller) upon which embodiments of the present invention may be implemented.

FIG. 2 is a block diagram showing an exemplary integrated circuit (or microcontroller) 200 upon which embodiments of the present invention may be implemented. Circuit 200 may be implemented on a single die and packaged as a "chip" or IC device. In this embodiment, integrated circuit 200 includes a bus 211, and coupled to bus 211 are synchronous random access memory (SRAM) 212 for storing volatile or temporary data during firmware execution, central processing unit (CPU) 214 for processing information and instructions, flash read-only memory (ROM) 216 for holding instructions (e.g., firmware), input/output (I/O) pins providing an interface with external devices and the like, and timer circuit 220. Timer circuit 220 is further described below. A test interface (not shown) may be coupled to integrated circuit 200 to perform debugging operations during startup and initialization of the integrated circuit. Circuit 200 may also include several programmable analog and digital blocks 221 for implementing functions that are stored in flash ROM 216.

In the present embodiment, flash ROM 216 stores parameters describing microcontroller 200, allowing microcontroller 200 to be programmed during production, during system testing, or in the field. It is contemplated that microcontroller 200 may also be self-programmed remotely. Flash ROM 216 also contains programming for programmable analog and digital blocks 221 while SRAM 212 contains programming for CPU 214.

Timer circuit 220 performs a timing function by generating a clock signal for synchronizing, pacing and coordinating the operations of a microcontroller. In one embodiment, timer circuit 220 is an oscillator circuit with trimmable current control. In another embodiment, timer circuit 220 is a phase locked loop circuit having a voltage controlled oscillator circuit with trimmable current control. In another embodiment, timer circuit 220 is a crystal oscillator circuit.

Figure 3:
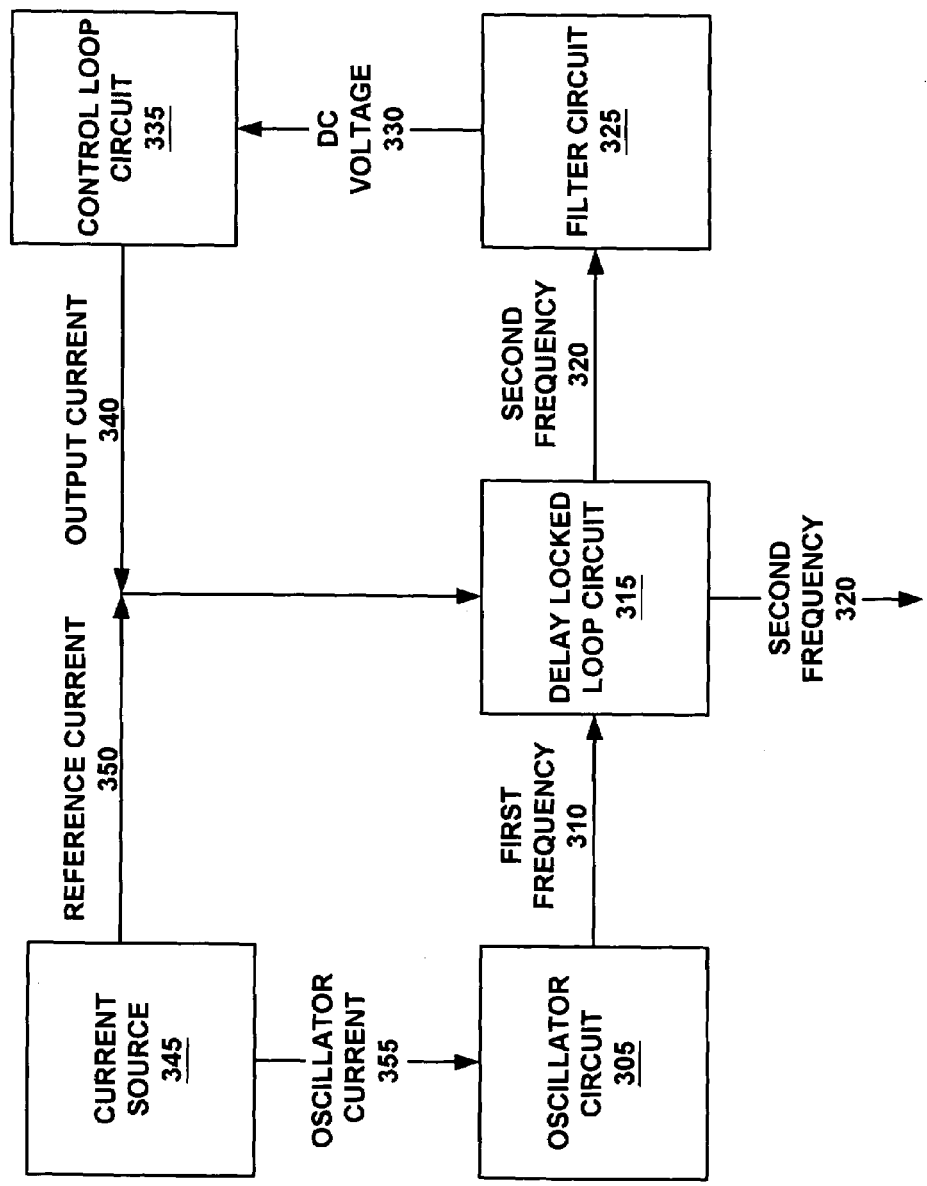
FIG. 3 is a block diagram of a frequency doubler circuit coupled to a current source in accordance with one embodiment of the present invention.

FIG. 3 is a block diagram 300 of a frequency doubler circuit 300 comprising a current source 345, in accordance with one embodiment of the present invention. In one embodiment, frequency doubler circuit 300 may be part of a microcontroller (e.g., integrated circuit 200 of FIG. 2).

Oscillator circuit 305 generates a first frequency signal 310. In one embodiment, oscillator circuit 305 may be a relaxation oscillator circuit. In another embodiment, oscillator circuit 305 may be a crystal oscillator circuit. In one embodiment, current source 345 generates an oscillator current 355 received at oscillator circuit 305 for generating first frequency signal 310.

Delay locked loop circuit 315 receives first frequency signal 310 and generates second frequency signal 320. In one embodiment, second frequency signal 320 is double the value of first frequency signal 310. For example, if the value of first frequency signal 310 is substantially 24 MHz, the value of second frequency signal 320 will be substantially 48 MHz.

It should be appreciated that second frequency signal 320 is the intended output of frequency doubler circuit 300. Second frequency signal 320 is also received at filter circuit 325 for converting second frequency signal 320 into DC voltage 330. In one embodiment, filter circuit 325 is a low-pass filter circuit.

Frequency doubler circuit 300 comprises control loop circuit 335 for controlling the duty cycle of frequency doubler circuit 300. Control loop circuit 335 receives DC voltage 330 that is generated by passing second frequency signal 320 through filter circuit 325. Control loop circuit 335 generates output current 340 for controlling the current of internal components of frequency doubler circuit 300 (e.g., inverters and transistors).

Current source 345 generates reference current 350. In one embodiment, current source 345 comprises a trimmable current control (e.g., trimmable components 610 of FIG. 6). In one embodiment, the trimmable current control comprises a plurality of digitally controlled trimmable components (e.g., trimmable current sources). In one embodiment, the trimmable current control comprises eight trimmable components. In one embodiment, reference current 350 is the same current as oscillator current 355.

Reference current 350 acts to augment output current 340 with a current that is trimmed to compensate for process variations in capacitance. The summation of reference current 350 and output current 340 allows frequency doubler circuit 300 to maintain a known duty cycle without the need for external capacitors.

Figure 4:
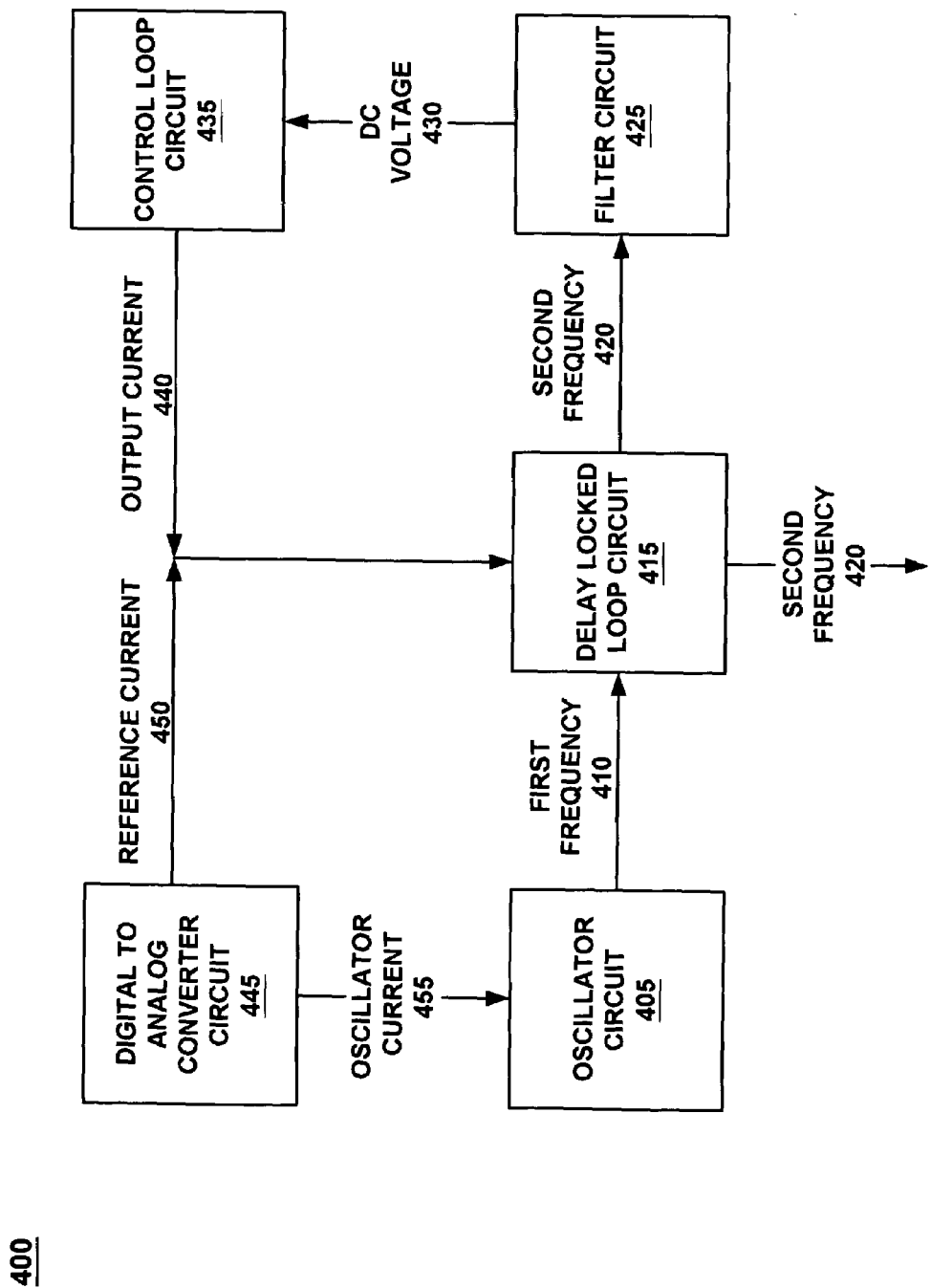
FIG. 4 is a block diagram of a frequency doubler circuit coupled to a digital to analog converter circuit in accordance with one embodiment of the present invention.

FIG. 4 is a block diagram of a frequency doubler circuit 400 coupled to a digital to analog converter circuit 445 in accordance with one embodiment of the present invention.

In one embodiment, frequency doubler circuit 400 may be part of a microcontroller (e.g., integrated circuit 200 of FIG. 2).

Frequency doubler circuit 400 of FIG. 4 operates in the same manner as frequency doubler circuit 300 of FIG. 3. However, current source 345 of FIG. 3 is replaced with digital to analog converter circuit 445.

Digital to analog converter circuit 445 generates reference current 450 and oscillator current 455. Oscillator current 455 acts as the current used in oscillator circuit 405 to generate first frequency signal 410. In one embodiment, digital to analog converter circuit 445 comprises a trimmable current control (digitally controlled trimmable components 730 of FIG. 7). In one embodiment, the trimmable current control comprises a plurality of trimmable components (e.g., trimmable current sources). In one embodiment, the trimmable current control comprises eight digitally controlled trimmable components.

Reference current 450 acts to augment output current 440 with a current that is trimmed to compensate for process variations in capacitance. The summation of reference current 450 and output current 440 allows frequency doubler circuit 400 to maintain a known duty cycle without the need for external capacitors.

Figure 5:
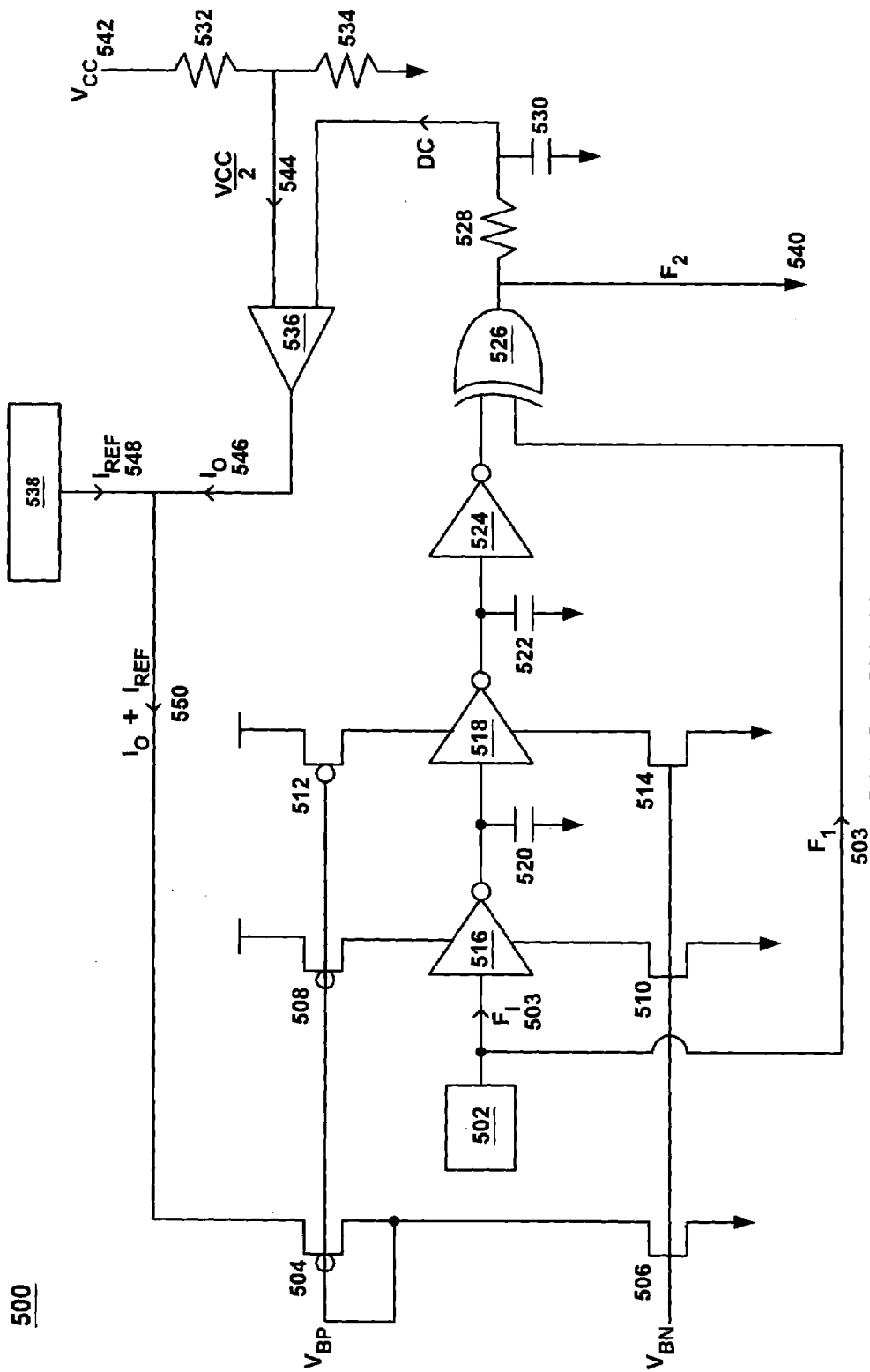
FIG. 5 is a circuit diagram of a frequency doubler circuit coupled to a current source in accordance with one embodiment of the present invention.

FIG. 5 is a circuit diagram of a frequency doubler circuit 500 coupled to a current source 538 in accordance with one embodiment of the present invention. In one embodiment, frequency doubler circuit 500 is part of a microcontroller (e.g., integrated circuit 200 of FIG. 2).

Oscillator circuit 502 generates a first frequency signal ($F_1$). In one embodiment, oscillator circuit 502 is a relaxation oscillator. In another embodiment, oscillator circuit 502 is a crystal oscillator. In one embodiment, the first frequency signal has a value of substantially 24 MHz.

The first frequency signal is received at a delay locked loop circuit comprising transistors 508, 510, 512 and 514, inverters 516, 518 and 524, capacitors 520 and 522, and exclusive OR gate 526. The first frequency signal goes through inverter 516 with capacitor 520 on the output, inverter 518 with capacitor 522 on the output, and inverter 524. This results in a delayed first frequency signal ($F_1'$).

Exclusive OR gate 526 receives both the first frequency signal and the delayed first frequency signal, generating a second frequency signal ($F_2$) with a frequency twice that of the first frequency signal. For example, where the first frequency signal is substantially 24 MHz, the second frequency signal is substantially 48 MHz.

It should be appreciated that the second frequency signal is the intended output of frequency doubler circuit 500. In one embodiment, the second frequency signal is utilized by a microcontroller (e.g., integrated circuit 200 of FIG. 2) as a clock signal.

The second frequency signal is also received at filter circuit 540 for converting the second frequency signal into a DC voltage 541. In one embodiment, filter circuit 540 comprises resister 528 and capacitor 530. In one embodiment, filter circuit 540 is a low-pass filter circuit.

Supply voltage (VCC) 542 is generated for operating operational amplifier (op-amp) 536. Supply voltage (VCC) 542 is split by resistors 532 and 534, resulting in split supply voltage (VCC/2) 544. In one embodiment, resistors 532 and 534 are of equal value.

Operational amplifier 536 receives DC voltage 541 and split supply voltage 544. Operational amplifier 536 generates output current ($I_O$) 546 to attempt to make the two inputs equal and to keep the duty cycle constant. Operational amplifier 536 adjusts output current 546 to keep a desired duty cycle. In one embodiment, operational amplifier 536 keeps the duty cycle of frequency doubler circuit 500 at 50% at a frequency signal of substantially 48 MHz.

Current source 538 generates a reference current ($I_{REF}$) 548. In one embodiment, current source 538 is a trimmable current control (e.g., trimmable components 610 of FIG. 6) comprising a plurality of trimmable components (e.g., trimmable current sources). In another embodiment, current source 538 is a digital to analog converter circuit control (e.g., trimmable components 720 of FIG. 7) comprising a plurality of trimmable components (e.g., trimmable current sources). In the present embodiment, current source 538 provides a current to oscillator circuit 502 for generating the first frequency signal and is trimmable to account for process variations.

Reference current 548 is added to output current 546, resulting in total current ($I_{TOT}$) 550. Total current 550 goes through transistors 504 and 506. In one embodiment, transistor 504 is a PMOS transistor and transistor 506 is an NMOS transistor. Total current 550 is mirrored through transistors 508, 510, 512 and 514. In one embodiment, transistors 508 and 512 are PMOS transistors and transistors 510 and 514 are NMOS transistors.

The current flowing through transistors 508 and 510 controls the charging and discharging of capacitor 520. Likewise, the current flowing through transistors 512 and 514 controls the charging and discharging of capacitor 522.

Increasing the current in inverters 516 and 518 causes capacitors 520 and 522 to charge and discharge at a faster rate. Likewise, decreasing the current in inverters 516 and 518 causes capacitors 520 and 522 to charge and discharge at a slower rate. The ability to control the rate at which capacitors 520 and 522 charge and discharge allows for the control of the duty cycle of frequency doubler circuit 500.

Reference current 548 acts to augment output current 546 with a current that is trimmed to compensate for process variations in capacitance. The summation of reference current 548 and output current 546 allows frequency doubler circuit 500 to maintain a known duty cycle without the need for external capacitors.

Figure 6:
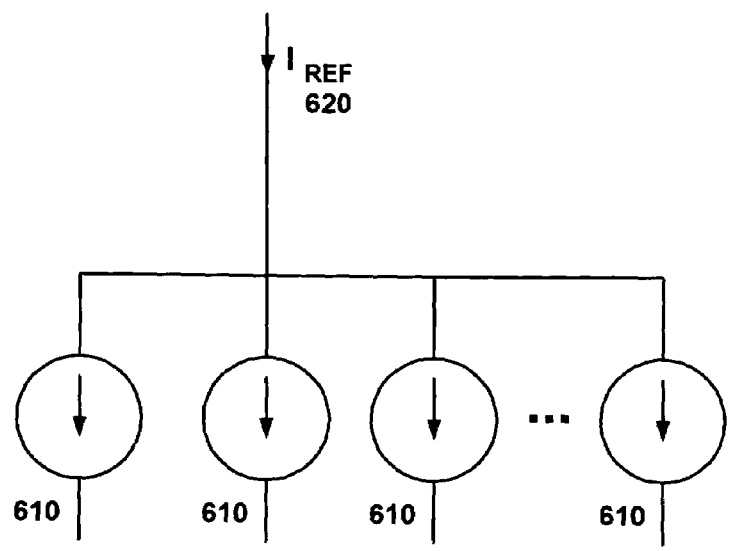
FIG. 6 is a circuit diagram of a current source with a plurality of trimmable components in accordance with one embodiment of the present invention.

FIG. 6 is a circuit diagram of a current source 600 (e.g., current source 345 of FIG. 3 or current source 538 of FIG. 5) with a plurality of trimmable components 610 in accordance with one embodiment of the present invention. Current source 600 comprises a trimmable current control (e.g., trimmable components 610) for generating reference current ($I_{REF}$) 620 (e.g., reference current 350 of FIG. 3). In one embodiment, the trimmable current control comprises a plurality of trimmable components 610. In this implementation, the current is trimmed by the introduction of current sources that provide binary adjustable current control. In one embodiment, the trimmable current control comprises eight trimmable components. In one embodiment, the trimmable current control is digitally controlled.

Figure 7:
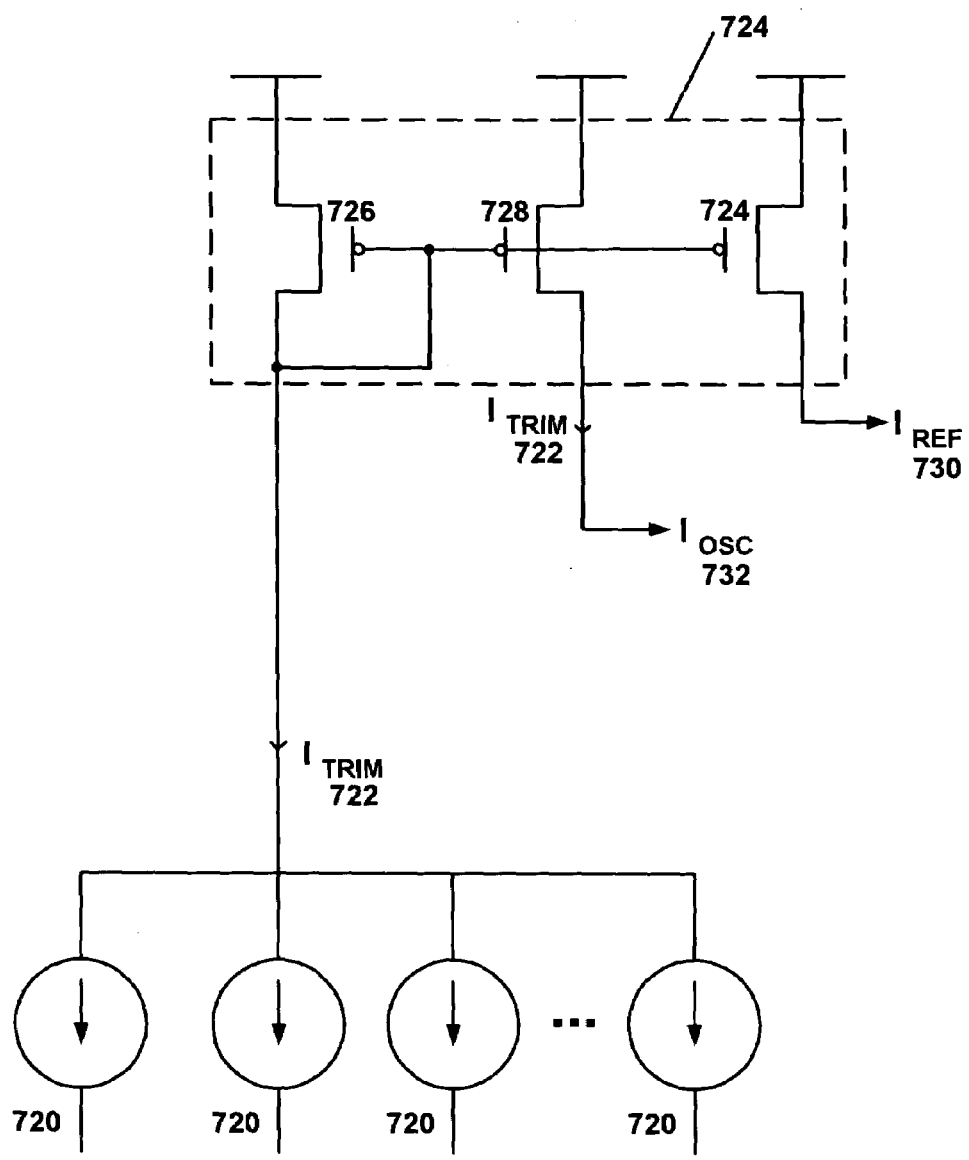
FIG. 7 is a circuit diagram of a digital to analog converter circuit with a plurality of trimmable components in accordance with one embodiment of the present invention.

FIG. 7 is a circuit diagram of a digital to analog converter circuit 700 (e.g., digital to analog converter circuit 445 of FIG. 4 or current source 538 of FIG. 5) with a plurality of trimmable components 730 in accordance with one embodiment of the present invention.

Digital to analog converter circuit 700 comprises a trimmable current control (e.g., trimmable components 720) for generating trim current ($I_{TRIM}$). In one embodiment, the trimmable current control comprises a plurality of trimmable components 720. In this implementation, the current is trimmed by the introduction of current sources that provide binary adjustable current control. In one embodiment, the trimmable current control comprises eight trimmable components. In one embodiment, the trimmable current control is digitally controlled.

In one embodiment, digital to analog converter circuit 700 comprises current mirror 724, comprising transistor 726, transistor 728 and transistor 729. In one embodiment, transistors 726, 728 and 729 are PMOS transistors. As trim current 722 passes through transistor 726, it is mirrored across transistor 728 and transistor 729.

A trimmable current control accounts for process variation, temperature variation and voltage variation. Reference current 730 acts to compensate for variations in capacitors of a frequency doubler circuit.

In one embodiment, digital to analog converter circuit generates oscillator current 732 in the same manner as described above for generating reference current 730. As such, oscillator current 732 is equal in value to reference current 730. In one embodiment, oscillator current 732 is received at an oscillator circuit (e.g., oscillator circuit 405 of FIG. 4) for use in generating a frequency signal.

The present invention provides a frequency doubler circuit wherein a reference current is determined by a trimmable current control. The reference current acts to augment an output current (e.g., a feedback current) with a current that is trimmed to compensate for process variations in capacitance. The summation of these two currents allows the frequency doubler circuit to maintain a known duty cycle without the need for external capacitors.

The preferred embodiment of the present invention, a frequency doubler circuit with trimmable current control, is thus described. While the present invention has been described in particular embodiments, it should be appreciated that the present invention should not be construed as limited by such embodiments, but rather construed according to the below claims.

What is claimed is:

1. A circuit comprising:
a current source for generating a reference current; and
a frequency doubler circuit coupled to said current source and receiving a first frequency signal and also receiving said reference current, said frequency doubler circuit generating a second frequency signal and using said reference current to compensate for process variation of capacitance and using said reference current to maintain a known duty cycle.

2. A circuit as recited in claim 1 wherein the value of said second frequency signal is substantially twice the value of said first frequency signal.

3. A circuit as recited in claim 1 further comprising a control loop circuit for generating an output current, said output current operating in conjunction with said reference current to compensate for process variation of capacitance and using said reference current to maintain a known duty cycle.

4. A circuit as recited in claim 1 wherein said current source comprises trimmable current control.

5. A circuit as recited in claim 4 wherein said trimmable current control comprises a plurality of trimmable components.

6. A circuit as recited in claim 1 wherein said current source is a digital to analog converter circuit.

7. A circuit as recited in claim 6 wherein said digital to analog converter circuit comprises a trimmable current control.

8. A circuit as recited in claim 7 wherein said trimmable current control comprises a plurality of trimmable components.

9. A circuit as recited in claim 6 wherein said digital to analog converter circuit is for generating an oscillator current used in an oscillator circuit, said oscillator circuit for generating said first frequency signal.

10. A circuit as recited in claim 9 wherein the value of said oscillator current is equal in value to the value of said reference current.

11. A circuit as recited in claim 5 wherein said plurality of trimmable components are digitally controlled.

12. A circuit as recited in claim 8 wherein said plurality of trimmable components are digitally controlled.

13. A circuit comprising:
an oscillator circuit for generating a first frequency signal;
a current source for generating a reference current; and
a frequency doubler circuit coupled to said current source and receiving a first frequency signal and also receiving said reference current, said frequency doubler circuit generating a second frequency signal and using said reference current to compensate for process variation of capacitance and using said reference current to maintain a known duty cycle.

14. A circuit as recited in claim 13 wherein the value of said second frequency signal is substantially twice the value of said first frequency signal.

15. A circuit as recited in claim 13 further comprising a control loop circuit for generating an output current, said output current operating in conjunction with said reference current to compensate for process variation of capacitance and using said reference current to maintain a known duty cycle.

16. A circuit as recited in claim 13 wherein said current source comprises trimmable current control.

17. A circuit as recited in claim 16 wherein said trimmable current control comprises a plurality of trimmable components.

18. A circuit as recited in claim 13 wherein said current source is a digital to analog converter circuit.

19. A circuit as recited in claim 18 wherein said digital to analog converter circuit comprises a trimmable current control.

20. A circuit as recited in claim 19 wherein said trimmable current control comprises a plurality of trimmable components.

21. A circuit as recited in claim 18 wherein said digital to analog converter circuit is for generating an oscillator current used in said oscillator circuit for generating said first frequency signal.

22. A circuit as recited in claim 21 wherein the value of said oscillator current is equal in value to the value of said reference current.

23. A circuit as recited in claim 17 wherein said plurality of trimmable components are digitally controlled.

24. A circuit as recited in claim 20 wherein said plurality of trimmable components are digitally controlled.

25. A microcontroller comprising:
a bus;
a processor coupled to said bus;
a memory unit coupled to said bus;
an oscillator circuit for generating a first frequency signal;
a current source for generating a reference current; and
a frequency doubler circuit coupled to said current source and receiving a first frequency signal and also receiving said reference current, said frequency doubler circuit generating a second frequency signal and using said reference current to compensate for process variation of capacitance and using said reference current to maintain a known duty cycle.

26. A microcontroller as recited in claim 25 wherein the value of said second frequency signal is substantially twice the value of said first frequency signal.

27. A microcontroller as recited in claim 25 further comprising a control loop circuit for generating an output current, said output current operating in conjunction with said reference current to compensate for process variation of capacitance and using said reference current to maintain a known duty cycle.

28. A microcontroller as recited in claim 25 wherein said current source comprises trimmable current control.

29. A microcontroller as recited in claim 27 wherein said trimmable current control comprises a plurality of trimmable components.

30. A microcontroller as recited in claim 25 wherein said current source is a digital to analog converter circuit.

31. A microcontroller as recited in claim 30 wherein said digital to analog converter circuit comprises a trimmable current control.

32. A microcontroller as recited in claim 31 wherein said trimmable current control comprises a plurality of trimmable components.

33. A microcontroller as recited in claim 30 wherein said digital to analog converter circuit is for generating an oscillator current used in said oscillator circuit for generating said first frequency signal.

34. A microcontroller as recited in claim 33 wherein the value of said oscillator current is equal in value to the value of said reference current.

35. A microcontroller as recited in claim 29 wherein said plurality of trimmable components are digitally controlled.

36. A microcontroller as recited in claim 32 wherein said plurality of trimmable components are digitally controlled.

* * * * *